US010177428B1

(12) United States Patent
Tsironis

(10) Patent No.: US 10,177,428 B1
(45) Date of Patent: Jan. 8, 2019

(54) COMPACT HARMONIC AMPLITUDE AND PHASE CONTROLLER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 15/615,048

(22) Filed: Jun. 6, 2017

Related U.S. Application Data

(60) Provisional application No. 62/346,245, filed on Jun. 6, 2016.

(51) Int. Cl.
*H03H 7/38* (2006.01)
*H01P 1/18* (2006.01)
*H01P 1/22* (2006.01)
*H01P 1/24* (2006.01)

(52) U.S. Cl.
CPC .............. *H01P 1/182* (2013.01); *H01P 1/222* (2013.01); *H01P 1/24* (2013.01); *H03H 7/38* (2013.01)

(58) Field of Classification Search
CPC .. H03H 7/38; H03H 7/40; H01P 1/182; H01P 1/222
USPC ........................... 333/17.3, 17.2, 263, 32, 33
See application file for complete search history.

(56) References Cited

U.S. PATENT DOCUMENTS

| 7,282,926 | B1 | 6/2007 | Verspecht et al. | |
| 7,595,709 | B1* | 9/2009 | Boulerne | G01R 31/2601 324/642 |
| 8,188,816 | B1* | 5/2012 | Tsironis | H01P 5/04 333/17.3 |
| 9,252,471 | B1 | 2/2016 | Tsironis | |
| 9,960,472 | B1* | 5/2018 | Tsironis | H01P 5/04 |

OTHER PUBLICATIONS

"Load pull characterization system for differential devices", [online], Conference 2003, Fall 2003, 62nd ARFTG IEEE Microwave Measurement [Retrieved on May 18, 2017]. Retrieved from Internet <URL: http://ieeexplore.ieee.org/document/1459774>.
Dual Directional Couplers, Model IPP-3515 Datasheet, [online], Innovative Power Products, [Retrieved on May 18, 2017]. Retrieved from Internet <URL: http://innovativepp.com/product/ipp-3151/>.

(Continued)

*Primary Examiner* — Stephen E Jones

(57) ABSTRACT

A compact remotely adjustable harmonic microwave attenuator and linear phase shifter (HAPC) is made using two mobile signal couplers (wave-probes) inserted back-to-back in a slabline which is terminated with 50 Ohms. The coupled ports of the wave-probes are connected with the input ports of a power combiner using flexible RF cables and the output port of the combiner is connected to the output port of the unit. The new structure allows reducing the required linear length of the slabline by half. The wave-probes are attached to the vertical axes of mobile carriages, which are movable to variable distances from the input port of the HAPC, corresponding to the adjustable transmission phases, whereas the depth, at which the wave-probes are inserted into the slabline, determines the coupling factors and thus the value of the attenuations.

13 Claims, 17 Drawing Sheets

(Top view)

(56) References Cited

OTHER PUBLICATIONS

"An Introduction to Multiport and Balanced Device Measurements" Application Note 1373-1, [online], Keysight Technologies, [Retrieved on May 30, 2017]. Retrieved from Internet <URL: http://www.keysight.com/main/facet.jspx?&cc=CA&lc=eng&k= application+note+1373-2&pSearch=tnmSearch&hasLuckySearch=true>.
Balun, [online], Wikipedia, [Retrieved on May 17, 2017]. Retrieved from Internet <URL: http://en.wikipedia.org/wiki/Balun>.
Variable Attenuators, [online], Microwaves 101, [Retrieved on May 17, 2017]. Retrieved from Internet <URL: http://www.microwaves101.com/encyclopedia/attenuatorvariable.cfm>.
Phase shifters, [online], Microwaves 101, [Retrieved on May 17, 2017]. Retrieved from Internet <URL: http://www.microwaves101.com/encyclopedia/phaseshifters.cfm>.
Waveguide Variable Attenuator, product catalog page 14, [online], Elmika [Retrieved on May 30, 2017]. Retrieved from Internet <URL: http://www.elmika.com/catalogs.html>.
Manual Step Attenuator, [online], Keysight Technologies [Retrieved on May 30, 2017]. Retrieved from Internet <URL: http://www.keysight.com/en/pd-1000001981%3Aepsg%3Apro-pn-8496A/manual-attenuator-4-ghz-110-db-10-db-steps?nid=-32728.536879121&cc=CA&Ic=eng>.
"Computer Controlled Microwave Tuner, CCMT", Product Note 41, Focus Microwaves Inc. 1998, pp. 2-4.
Trombone Line Stretchers, ST series, Datasheet, [online] Microlab, [Retrieved on May 30, 2017]. Retrieved from Internet <URL: https://microlabtech.com/st-15n.html >.

\* cited by examiner

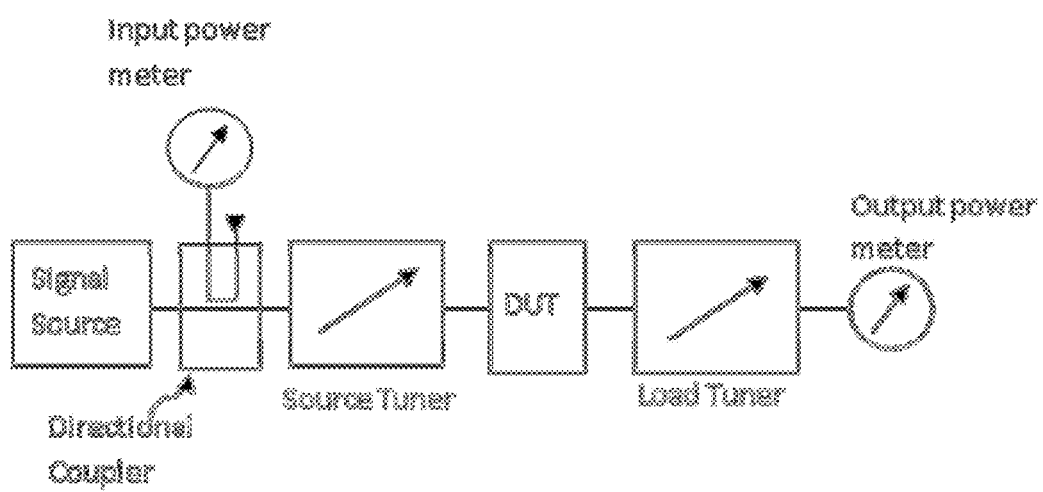
FIG. 1: Prior art

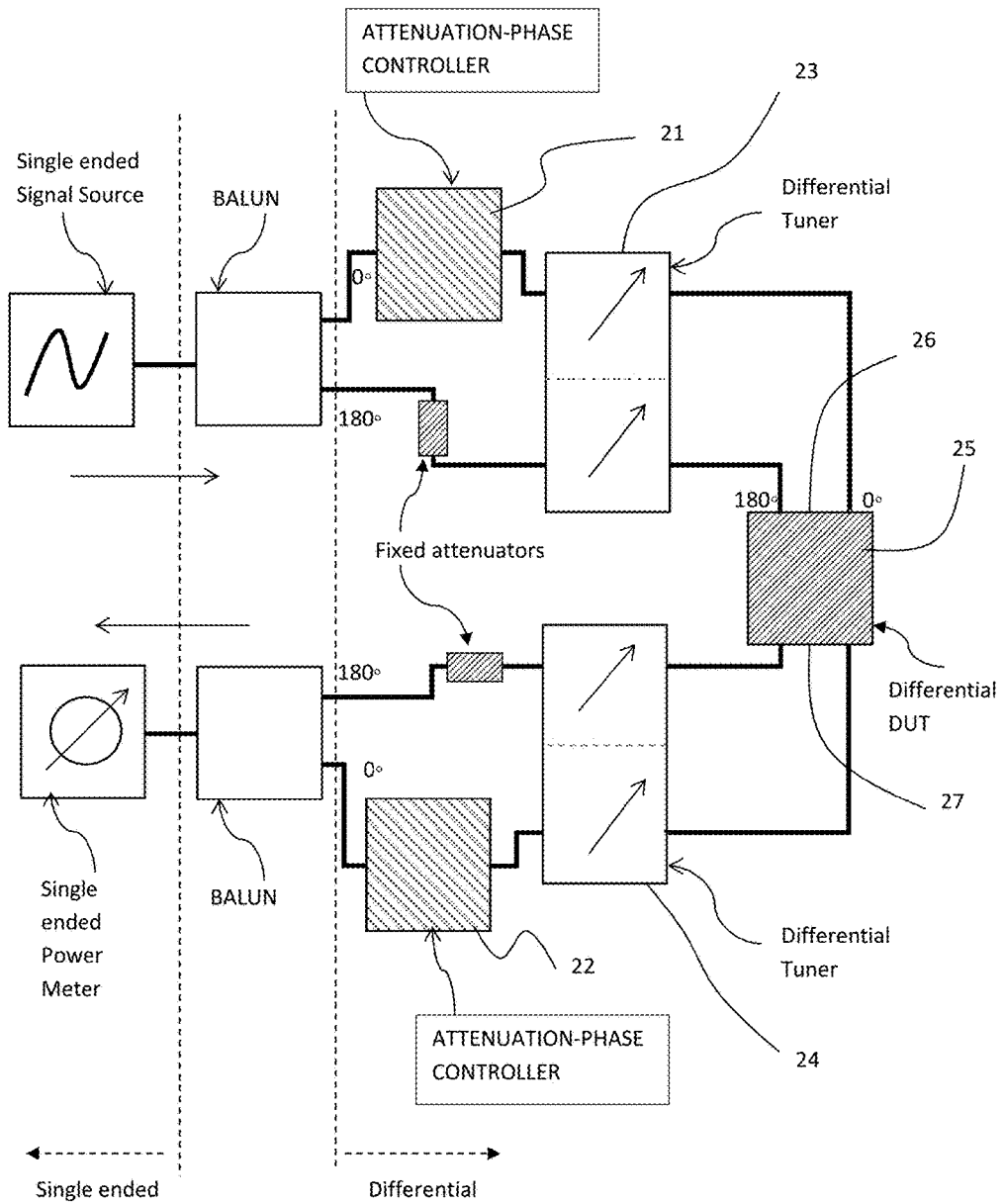
FIG. 2: Prior art

FIG. 3A: Prior art
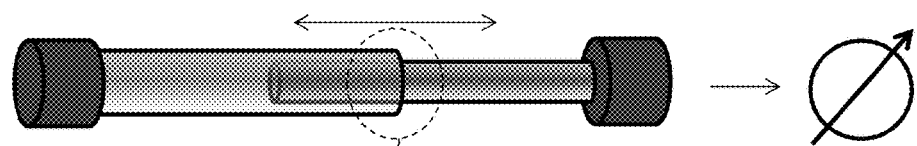
FIG. 3B: Prior art
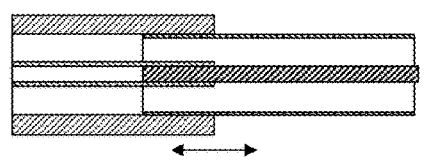
FIG. 3C: Prior art
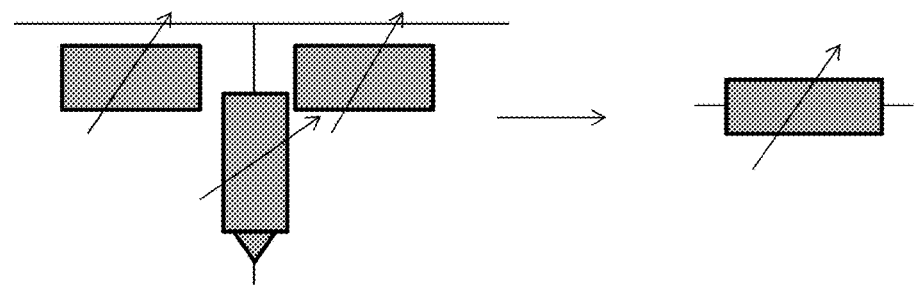
FIG. 3D: Prior art
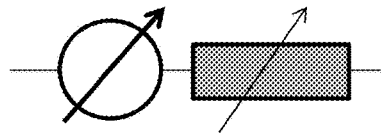

FIG. 4A: Prior art
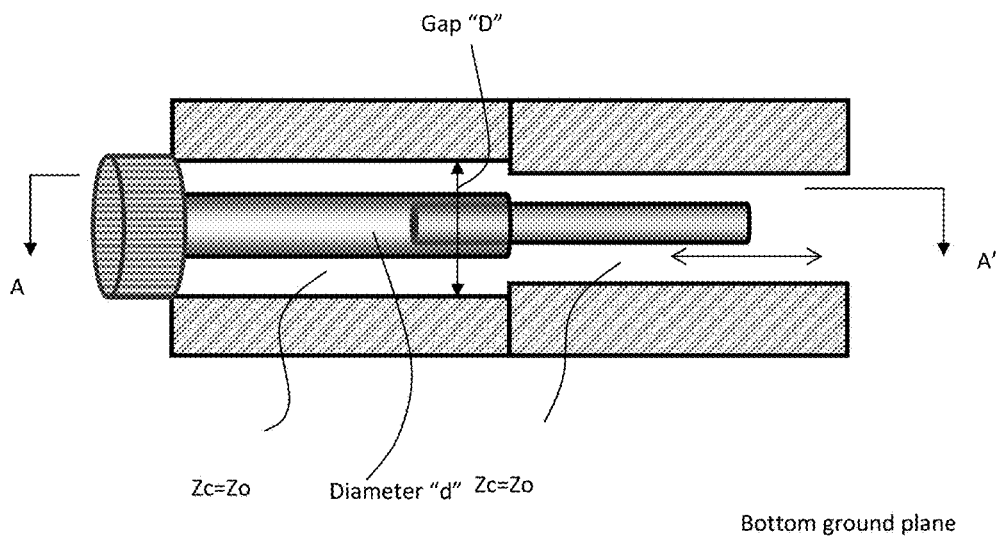
FIG. 4B: Prior art
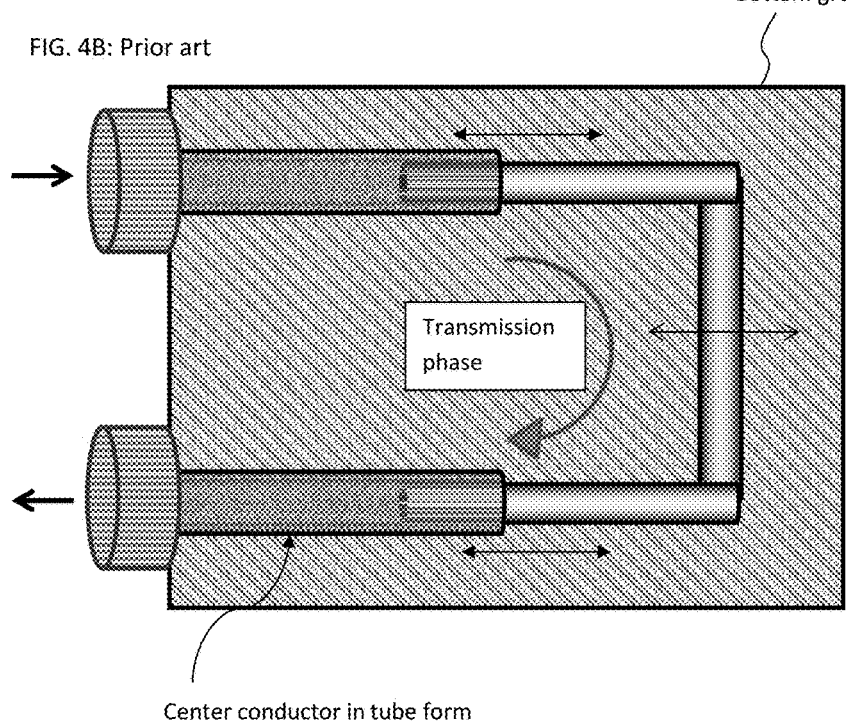

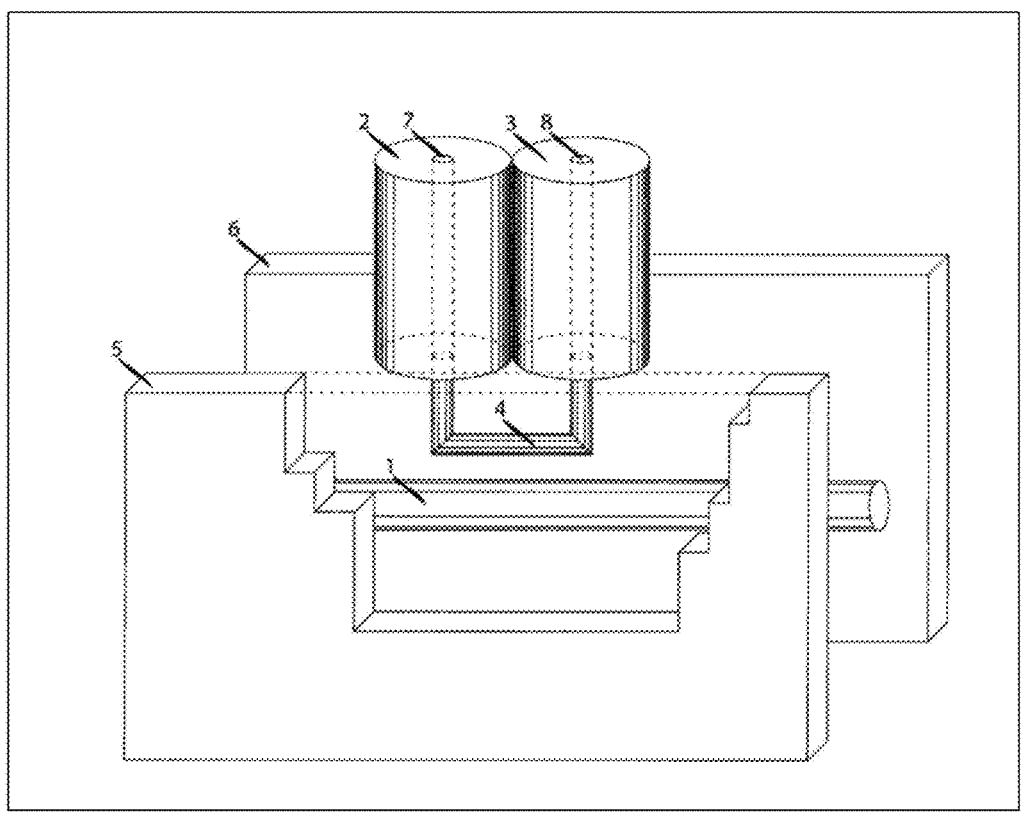
FIG. 5: Prior art

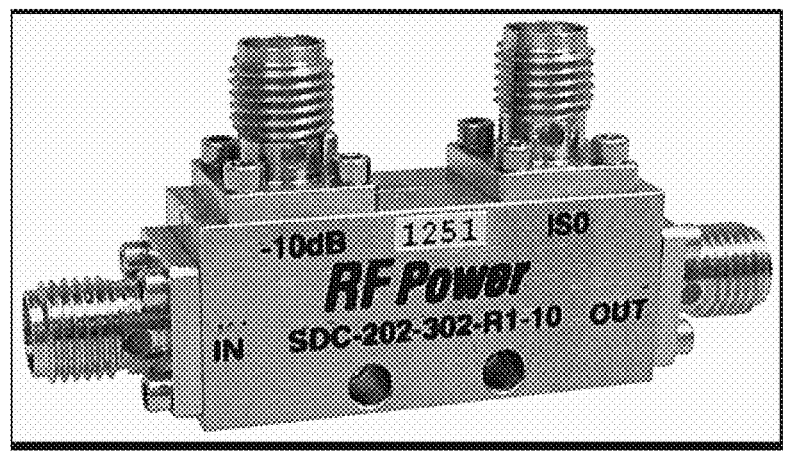
FIG. 6A: Prior art
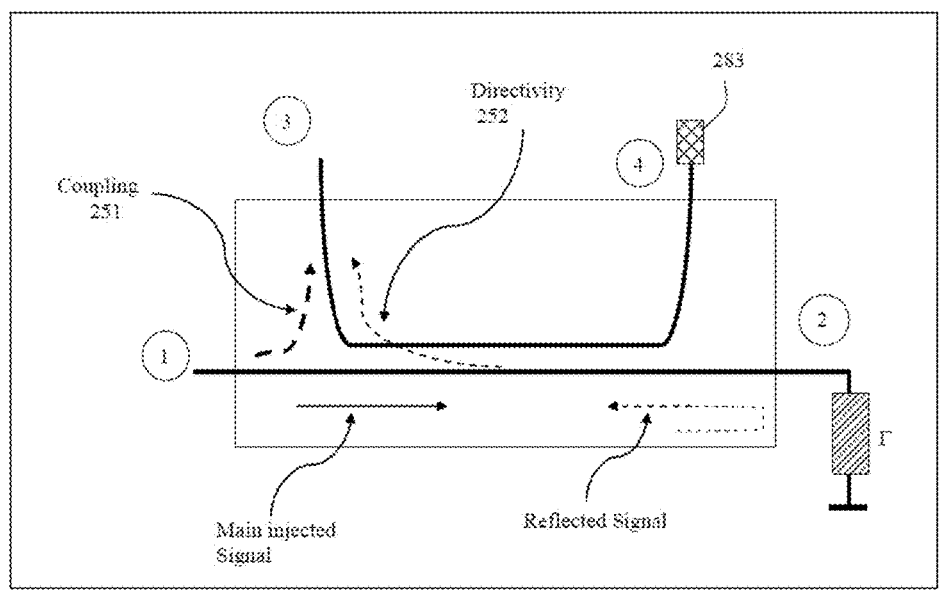
FIG. 6B: Prior art

FIG. 9 (Top view)

Figure 13:
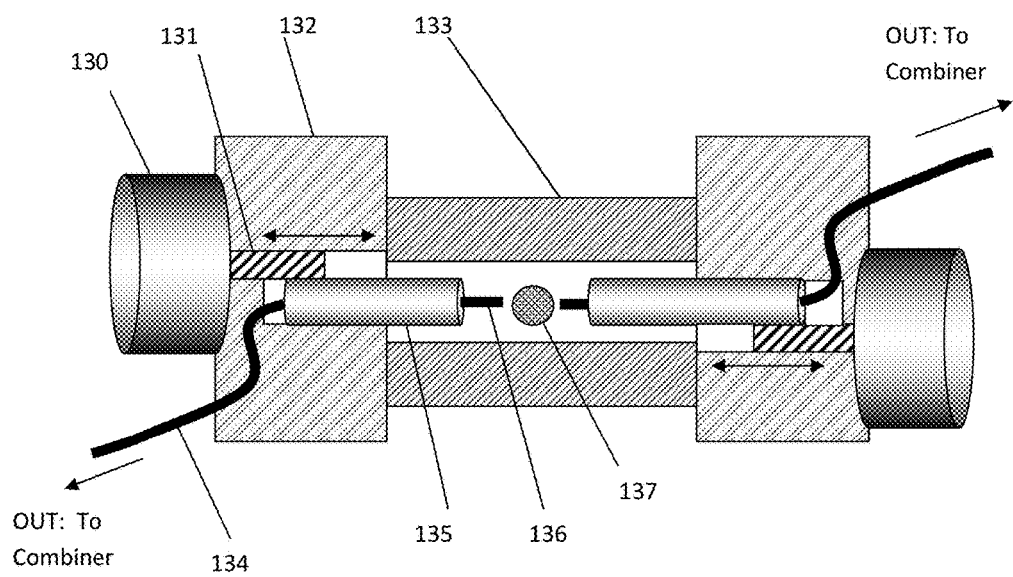

FIG. 13 (cross section)

$[S] = [S1] * [S00]^{-1} * [S2]$ $[S] = [S2] * [S00]^{-1} * [S1]$

COMPACT HARMONIC AMPLITUDE AND PHASE CONTROLLER

PRIORITY CLAIM

This application claims priority on provisional 62/346,245, filed on Jun. 6, 2016 titled "Compact Harmonic Amplitude and Phase Controller".

CROSS-REFERENCE TO RELATED ARTICLES

1. "Load pull characterization system for differential devices", [online], Conference 2003, Fall 2003, $62^{nd}$ ARFTG IEEE Microwave Measurement [Retrieved on 2017 May 18]. Retrieved from Internet <URL: http://ieeexplore.ieee.org/document/1459774>
2. Dual Directional Couplers, Model IPP-3515 Datasheet, [online], Innovative Power Products, [Retrieved on 2017 May 18]. Retrieved from Internet <URL: http://innovativepp.com/product/ipp-3151/>
3. "An Introduction to Multiport and Balanced Device Measurements" Application Note 1373-1, [online], Keysight Technologies, [Retrieved on 2017 May 30]. Retrieved from Internet <URL: http://www.keysight.com/main/facet.jspx?&cc=CA&lc=eng&k=application+note+1373-2&pSearch=tnmSearch&hasLuckySearch=true>
4. Balun, [online], Wikipedia, [Retrieved on 2017 May 17]. Retrieved from Internet <URL: http://en.wikipedia.org/wiki/Balun>
5. Variable Attenuators, [online], Microwaves 101, [Retrieved on 2017 May 17]. Retrieved from Internet <URL: http://www.microwaves101.com/encyclopedia/attenuatorvariable.cfm>
6. Phase shifters, [online], Microwaves 101, [Retrieved on 2017 May 17]. Retrieved from Internet <URL: http://www.microwaves101.com/encyclopedia/phaseshifters.cfm>
7. Waveguide Variable Attenuator, product catalog page 14, [online], Elmika [Retrieved on 2017 May 30]. Retrieved from Internet <URL: http://www.elmika.com/catalogs.html>
8. Manual Step Attenuator, [online], Keysight Technologies [Retrieved on 2017 May 30]. Retrieved from Internet <URL: http://www.keysight.com/en/pd-1000001981%3Aepsg%3Apro-pn-8496A/manual-attenuator-4-ghz-110-db-10-db-steps?nid=-327280.536879121&cc=CA&lc=eng>
9. "Computer Controlled Microwave Tuner, CCMT", Product Note 41, Focus Microwaves Inc. 1998, pages 2-4.
10. Tsironis, U.S. Pat. No. 9,252,471, "Wideband attenuation and phase controller".
11. Verspecht et al. U.S. Pat. No. 7,282,926, "Method and an apparatus for characterizing a high-frequency device-under-test in a large signal impedance tuning environment".
12. Trombone Line Stretchers, ST series, Datasheet, [online] Microlab, [Retrieved on 2017 May 30]. Retrieved from Internet <URL: https://microlabtech.com/st-15n.html>

BACKGROUND OF THE INVENTION

This invention relates to general microwave testing and in particular to testing of differential microwave transistors (DUT) in the frequency and time domain using Load Pull (see ref. 1). Load pull is the method by which the load impedance presented to the DUT at a given frequency is changed systematically and the DUT performance is registered, with the objective to find an optimum depending on the overall design objectives. This may be maximum power, efficiency, linearity or else.

Each port on a connectorized RF device comprises two terminals. When one terminal connection is used to transmit the RF signal and the other is used as a ground reference, the port is referred to as "single-ended". Traditionally, most RF devices have been designed to operate in this mode. When a terminal is designed to reference a signal on another terminal (and not the ground terminal), it is operating in a "differential" mode (see ref. 3). The terminal pair is known as a differential or "balanced" port. These circuits are designed to have a pair of electrically symmetrical signal paths. Signals are transmitted through the device 180 degrees out-of-phase with respect to one another. Any signal that is "common" or in-phase to both terminals will ideally be rejected, and will not pass through the circuit. This characteristic gives the device a lower sensitivity to electromagnetic interference (EMI).

A differential load pull setup is shown in FIG. 2. A single ended signal source injects power into a BALUN, see ref. 4. A BALUN (Balanced-Unbalanced) is a component which generates a differential signal from a single ended one or the opposite. It has three terminals; the input terminal relative to a common (ground) terminal creates a single ended input/output port and two terminals create the differential output/input port. BALUNs can be used in both directions. The accuracy of the measurement depends on the precision with which the phase opposition and the amplitude equality of the signals at the differential port. Ideally the two signals must have the same amplitude and a phase difference of 180°. In reality this is never the case. Therefore a real test system shall provide for continuous and fine adjustment of the differential signal components, both in amplitude and phase, both before and after the DUT. In FIG. 2 this is done using Variable Attenuation and Phase Shifters (21, 22). The differential tuners (23, 24) create true differential impedance presented to the differential DUT (25) at both its input (26) and output (27) terminals. In case of harmonic power injection and/or generation by the DUT, the harmonic balance of phase must be also guaranteed; for this a harmonic amplitude and phase controller (HAPC) is required.

PRIOR ART

Variable attenuators (see ref. 5) and phase shifters (see ref. 6) have been known for a long time. Finely adjustable variable attenuators are known in waveguide transmission structures (see ref. 7); in coaxial microwave structures only step attenuators are known (see ref. 8). Waveguide transmission lines are impractical for frequencies below 3 GHz, because of their size (a WR 340 waveguide—2.2-3.3 GHz, is a rectangular tube 3.56" wide and 1.86" high) and limited frequency bandwidth (less than one octave, therefore unsuitable for harmonic tuning). Linear, finely adjustable phase shifters (line stretchers) are also known, see ref. 9. The structure proposed in ref. 10 uses absorbing material in line with the line stretcher for attenuation control; this may create unnecessary reflections. The structure proposed in the present invention uses, instead, large band couplers which, by nature, have better reflection behavior.

A traditional directional coupler (see ref. 2) comprises an input port, an output port a coupled port and an isolated port. Such couplers are available only as standalone RF components with fixed coupling factor and electrical length between the input and coupling ports. They cannot be part of an adjustable environment. The only way to adjust the electrical length and attenuation is to insert a line stretcher (see ref. 12) at the input or the coupled port and a variable attenuator on the coupled port. The wave-probe (see ref. 11) disposes of all that. Its simple structure allows it to be inserted into the slot of the slabline to create an adjustable coupling, and be moved horizontally along the slabline to adjust the phase, see FIG. 13. Other than harmonic attenuation and phase controllers which use an "in-line" arrangement of the wave probes, and which require a total slabline length of at least 2 wavelengths, the apparatus of this invention employs a "diametric" (opposite) arrangement which allows "double" use of slabline length and thus reduces the total size of the apparatus by a factor of 2.

BRIEF SUMMARY OF THE INVENTION

Figure 7:
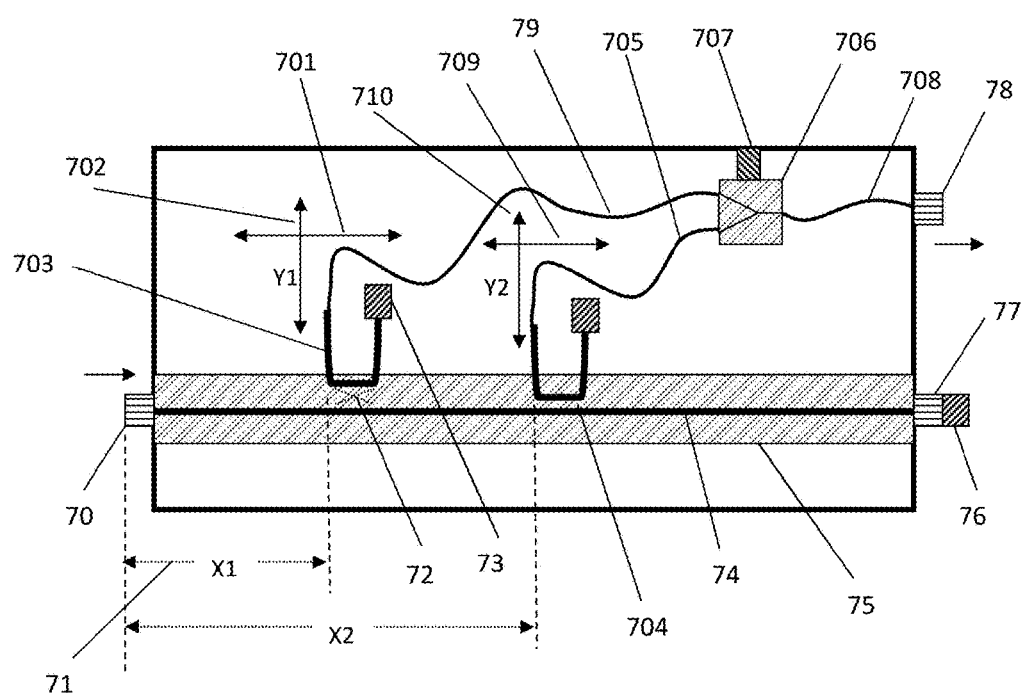

The principle of the harmonic amplitude (attenuation)/phase controller (HAPC) is shown in principle in FIG. 7: it uses, as transmission media, a section of slabline (75), at least two compact mobile signal couplers (wave-probes) (703, 704), sections of flexible coaxial RF cable (79, 705) and a fixed (707) power (signal) combiner (706); the total is assembled using at least two mobile carriages (see FIG. 9), sliding on the slabline (75) and the same basic technology as slide screw impedance tuners (see ref. 9). However, instead of the reflective tuning probes (slugs) in ref. 9 the vertical axes hold wave-probes (72, 704), (see also FIGS. 5, 9, 13 and 14) and ref. 11) of which the isolated port is matched (73) and the coupled port (703) is connected to the signal combiner (706). Both wave-probes can move horizontally (701, 709) and vertically (Y1, Y2).

The vertical axes (99) in the carriages (92) can insert (702) the wave-probe to various depths (Y1, Y2) into the slabline (93) and control this way the coupling factor (72) and thus the amount of energy flowing from the input port (70, 90) into the wave-probes (703, 91, 908) and from there, through the signal combiner (901, 706), which is connected with the wave-probes using flexible RF cables (79, 705, 909, 902), to the output port (78, 98). The carriages can move the wave-probes along the slabline (73, 93) thus changing the phase (71) between each of the wave-probes and the input port. This controls the transmission phase between the input and output ports on each path (90 TO 98 via 902 and 90 to 89 via 909) independently. By consequence simple X-Y (horizontal-vertical) movement control of the carriages and the vertical axes is translated into an attenuation/phase control of two parallel wideband signal transmissions, which are then combined at the output of the signal combiner (901) creating a synthesized signal, which can be processed to control harmonic transmission factors independently.

DETAILED DESCRIPTION OF THE DRAWINGS

The invention will be better understood in view of the included drawings of which
FIG. 1 depicts prior art, a typical load pull test system.
FIG. 2 depicts prior art, a typical differential load pull test system.
FIGS. 3A through 3D depict prior art; FIG. 3A depicts structural and schematic diagrams of linear phase shifter, FIG. 3B depicts cross section of linear phase shifter, FIG. 3C depicts symbolic attenuator, and FIG. 3D depicts symbolic combination of attenuator and phase shifter.
FIGS. 4A through 4B depict prior art; FIG. 4A depicts the structural detail of the coaxial and slabline transition in a linear phase shifter; FIG. 4B depicts the overall top view of a phase shifter with fixed position of input and output ports.

Figure 8:
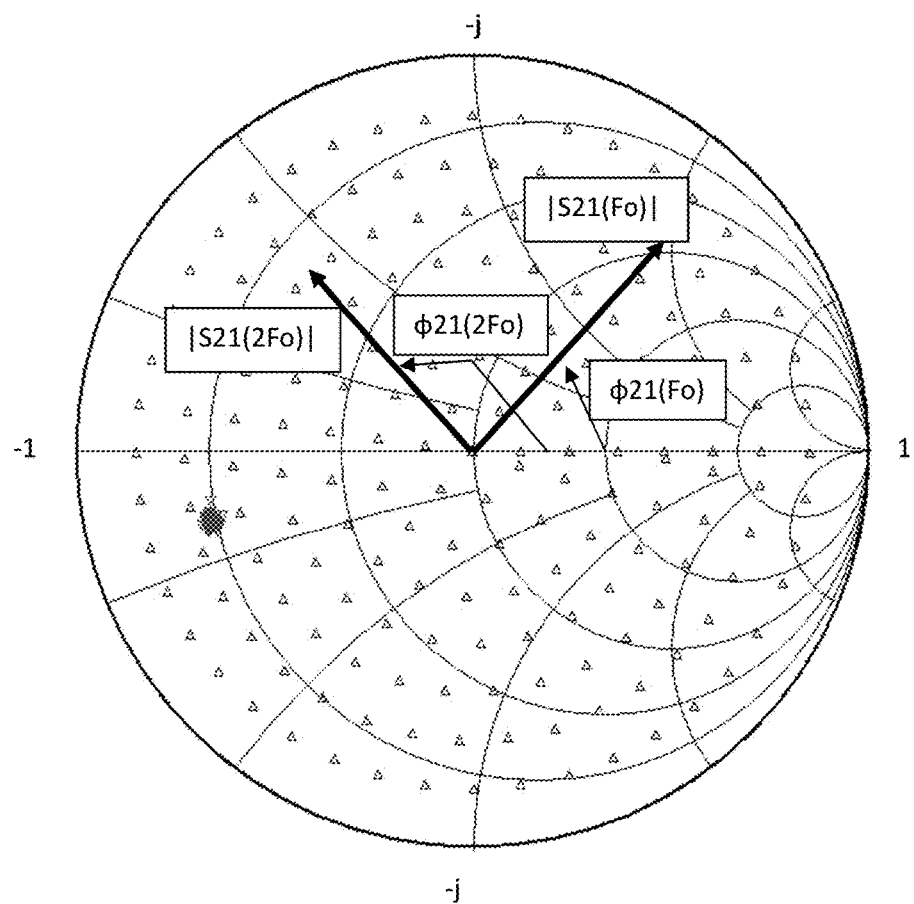
Figure 9:
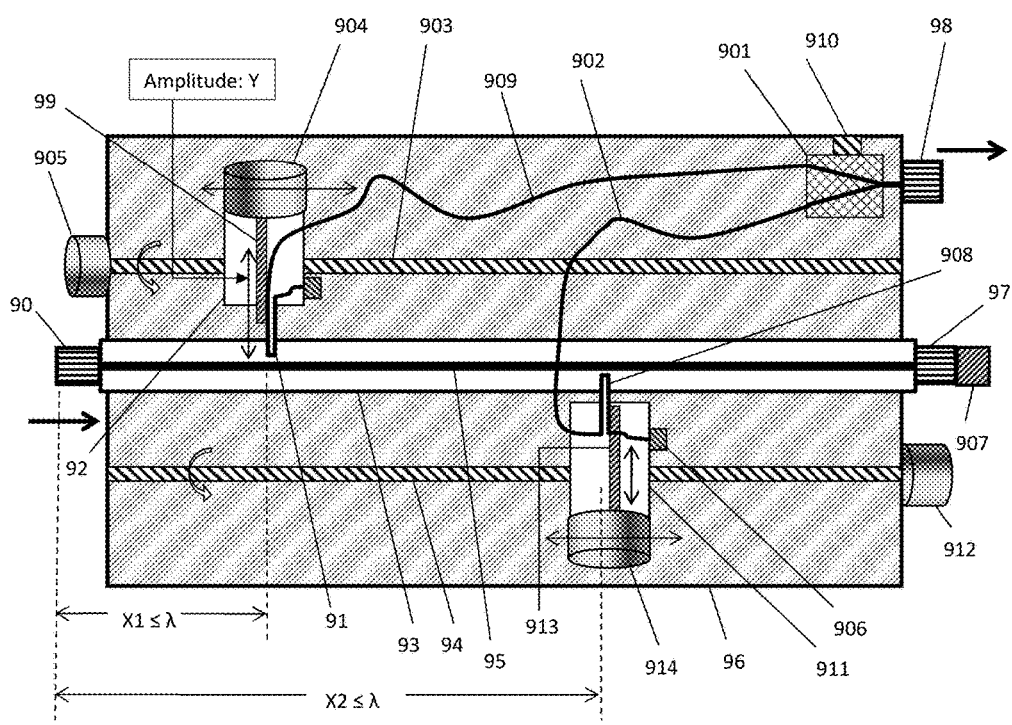
Figure 10:
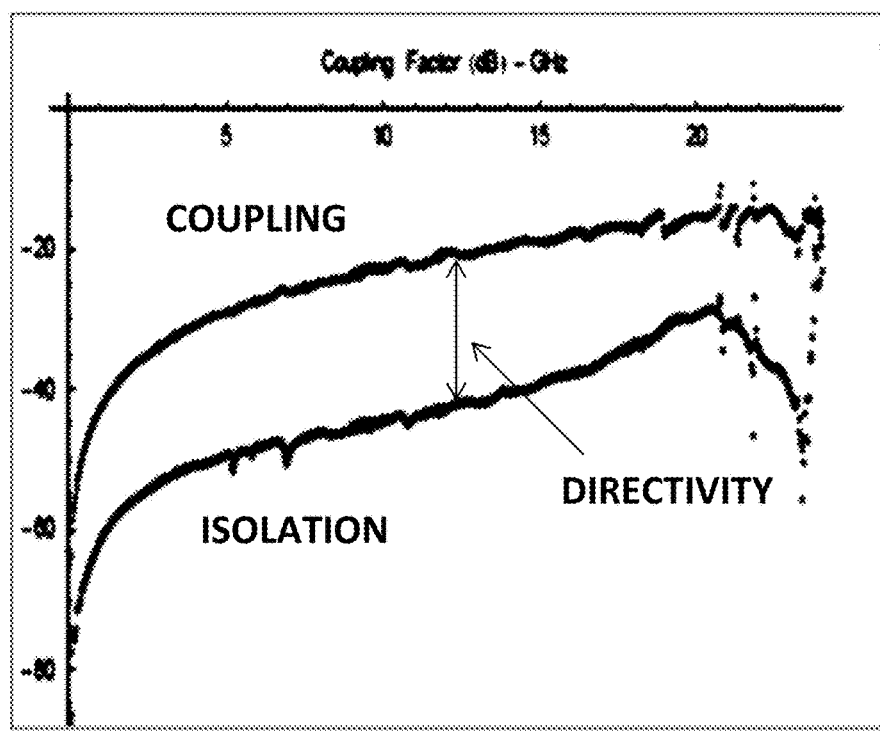
Figure 11:
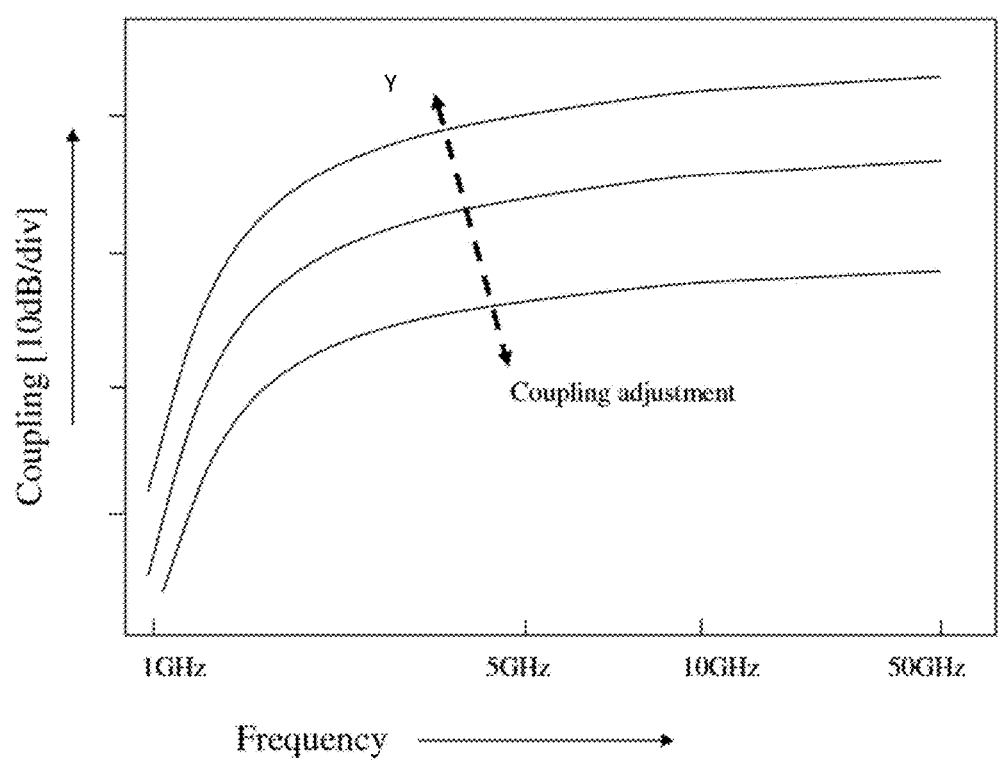
Figure 12:
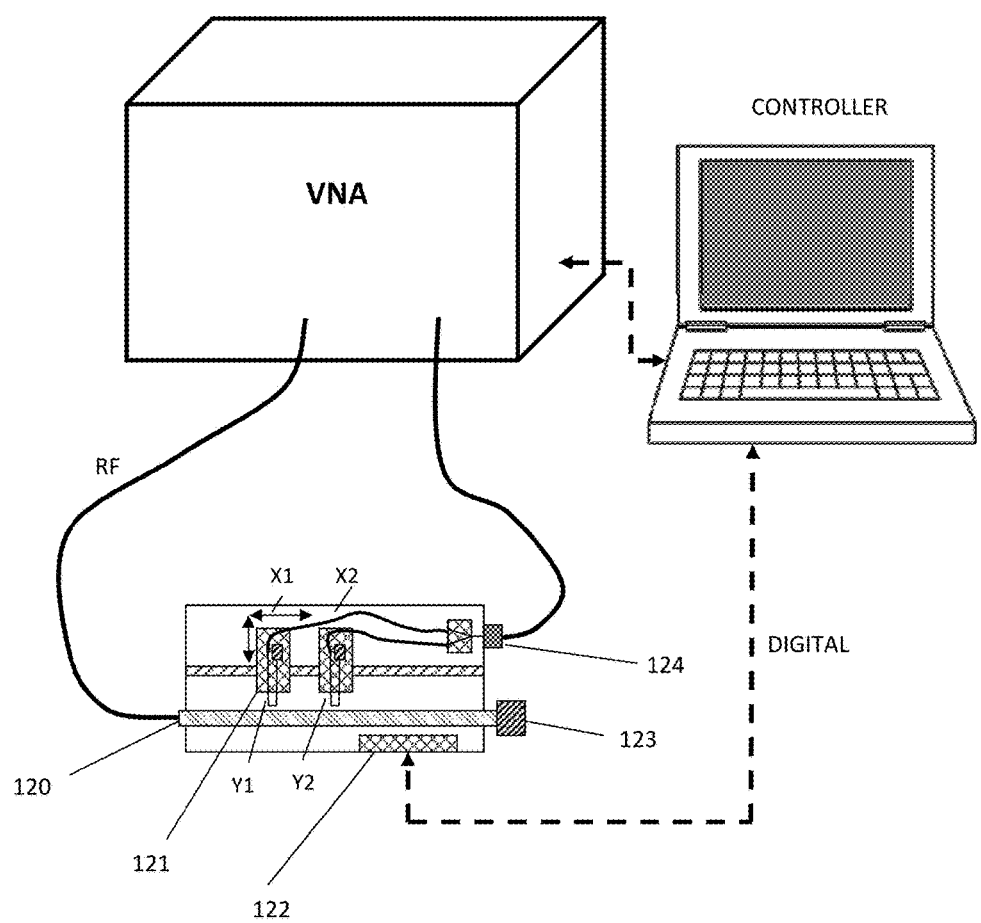
Figure 14:
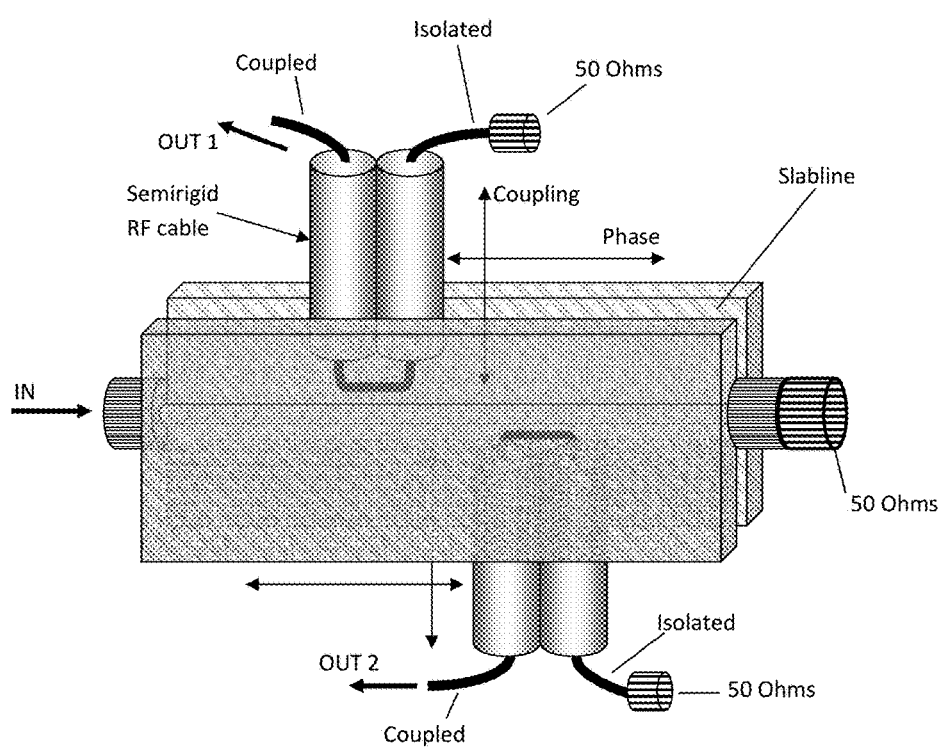
Figure 15A:
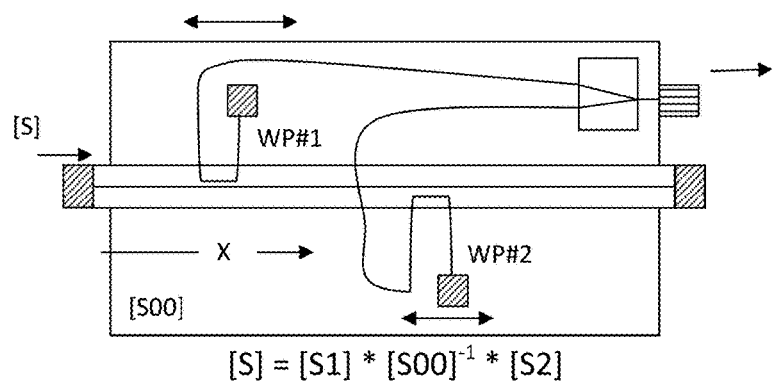
Figure 15B:
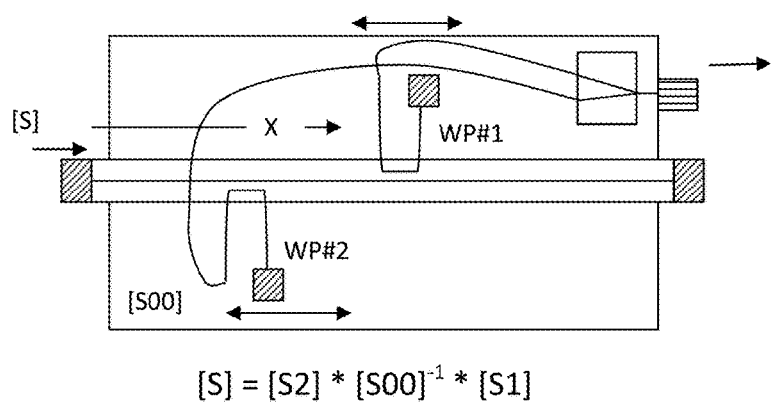
Figure 16:
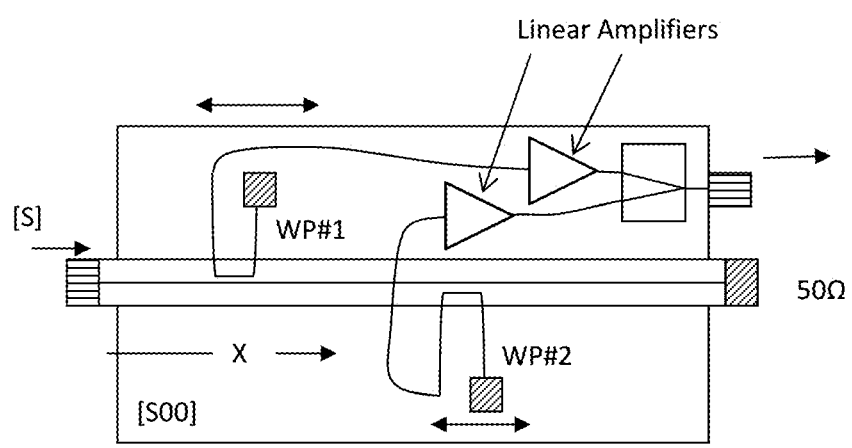
Figure 17:
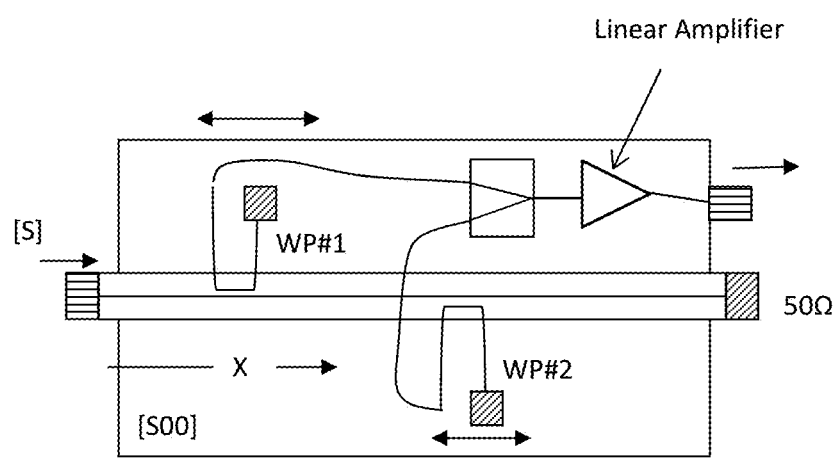

FIG. 5 depicts prior art, the perspective 3D view of a cut through a wave-probe type signal coupler comprising semi-rigid coaxial cables (2, 7, 3, 8), slabline (5, 6), center conductor (1) and magnetic loop (4).
FIGS. 6A through 6B depict prior art: FIG. 6A depicts a picture of a commercially available signal coupler and FIG. 6B depicts symbolic definitions in a bidirectional signal coupler: Port 1 is input port, port 3 is coupled port, port 2 is output port and port 4 (283) is isolated port. Signal ratio from port 1 to port 3 is called "coupling" (251) and the ratio between this (251) and the signal coming from port 2 is called directivity (252).
FIG. 7 depicts the basic structure of the adjustable harmonic attenuation and phase shifter (HAPC).
FIG. 8 depicts measured transmission factor vectors of the HAPC as a function of coupling factor and phase at the fundamental and one harmonic frequency.
FIG. 9 depicts top view of detailed structure of automated harmonic attenuation and phase controller (HAPC).
FIG. 10 depicts measured wideband response of coupling and isolation of wave-probe used in HAPC.
FIG. 11 depicts coupling control of wave-probe via depth control of the probe into the slabline.
FIG. 12 depicts calibration test setup for HAPC using PC controller and vector network analyzer (VNA).
FIG. 13 depicts cross section of diametric arrangement of wave-probes in a slabline.
FIG. 14 depicts a 3D presentation of the compact harmonic attenuation and phase controller using two wave-probes.
FIGS. 15A through 15B depict the two possible horizontal settings, during operation, of the wave-probes and associated de-embedding relations: FIG. 15A depicts wave-probe #1 being closer to the input port; FIG. 5B depicts wave-probe #2 being closer to the input port.
FIG. 16 depicts the compact harmonic attenuation and phase controller using two linear amplifiers in the coupled path of the wave-probes.
FIG. 17 depicts the compact harmonic attenuation and phase controller using one linear amplifier in the combined coupled path of the wave-probes.

DETAILED DESCRIPTION OF THE INVENTION

The HAPC exploits the wideband and easily adjustable properties of the compact signal coupler of FIGS. 5 and 14, also called "wave-probe". The compactness and easy manufacturing of this device, combined with the simple handling inside the slabline allows combining this technology with the existing slide screw impedance tuner movement control technology (see ref. 9) in creating a new component, the Harmonic Attenuation-Phase Controller (HAPC) allowing efficient control of attenuation and phase of a transmission media at fundamental and harmonic frequencies. All existing communication and movement control technology of the tuners (ref. 9) is implemented into this new design, including motor gear and control, precise horizontal and vertical axis control and computer controlled remote operation. The inherent large bandwidth and simple coupling adjustability of the wave-probe (see FIG. 10) overcomes critical bandwidth and spurious limitations of prior designs (see ref. 10). The distance between the wave-probe loop (704) and the center conductor (74) can be adjusted (710) and controls the coupling factor (FIG. 11).

The wave-probe (FIGS. 5, 13, 14) is a basic electromagnetic loop, made as the folded exposed section of part of the center conductor of a semi-rigid RF coaxial cable. It has wideband coupling and isolation behavior (FIG. 10) sufficient for the application. The difference between coupled and rejected signal (Directivity) varies between 15 and 20 dB. By approaching the loop to the center conductor of the slabline one increases the coupling factor (see FIG. 11). The wideband frequency response remains intact. This is a major advantage because it offers predictable response at the fundamental and the harmonic frequencies.

By moving the wave-probe loops (91, 908, 703, 704) closer or further away from the input port (70, 90) changes the transmission phase of the signal path from the input port (70, 90), through the wave-probe couplers (91, 908, 703, 704) to the signal combiner (706, 901) and through the cable (708) to the output port (78, 98). Because of the horizontal wave-probe loop movement (701, 709) the RF cables (79, 705, 909, 902) must be flexible and must allow full expansion and contraction for the wave-probes moving from the input to the output port of the slabline. The output port of the slabline (77, 97) is terminated with the characteristic impedance (76, 907), in order to eliminate reflected waves travelling towards the input port, which would interfere with the signal coupled into the wave-probes.

In more detail the HAPC is shown in FIG. 9. The unit is mounted in a housing (96) in which the slabline (93) traverses from the input port (90) to the auxiliary port (97), which in fact is the output port of the slabline itself, but is not used in this apparatus. The auxiliary port is terminated using a matched load (907). The lead screws (94, 903) control the horizontal positions of the carriages (92, 911) independently. The lead screws are rotated by stepper motors (905, 912). The carriages (92, 911) comprise precision vertical axes (99, 913), which are controlled by additional stepper motors (904, 914). All motors are controlled via electronic control boards and external PC, as shown in FIG. 12.

A cross section of the HAPC is shown in FIG. 13; the wave-probe (135) is mounted on the vertical axis (131) and driven by the motor (130) which is mounted on the carriage (132) and travels on the slabline walls (133). The wave-probe magnetic loop (136) approaches and couples to the center conductor (137) and the coupled signal exits from the coupled port (134). The second wave-probe is mount diametrically to the first one.

The vertical axes (99, 913) hold the body of the wave-probes (91, 908). They can move the wave-robes inside the slot vertically closer of further away from the center conductor (95). Changing the distance to the center conductor changes the coupling factor (as shown in FIG. 11). This means the amount of signal power transferred from the input port (90) to the output port (98) can be adjusted. This corresponds to the adjustable attenuation. The coupled port of the wave-probes is connected to the, permanently mounted (910), signal combiner (901) using flexible coaxial RF cables (902, 909) and then to the output port (98). The isolated ports of the wave-probes are terminated with characteristic impedance (906). The cables must allow the carriages to move along enough distance on the slabline to cover the required carriage (92, 911) travel and thus the angle of the transmission phase. If a full circle is required this distance must be one wavelength λ. The wavelength λ in air is equal: λ [cm]=30/Frequency[GHz]. i.e. for 1 GHz this is 30 cm horizontal travel and for 10 GHz this is 3 cm. The transmission phase is linearly proportional to the distance (X) of each wave-probe from the input port: Φ (rad)=−2*π*X/λ. The change in phase δΦ=−2*π*δX/λ can be accurately controlled by horizontal movement of the carriage. The phase of the section between wave-probe and output port remains constant.

The HAPC can be calibrated and used in automated test setups in order to control the instant phase of the transmission factor between ports (90, 120) and (98, 124) at each harmonic frequency independently in a setup shown in FIG. 12, whereby the slabline is terminated with Zo at its idle port (123). To be able to set the HAPC system in a condition for doing so, it has to be calibrated beforehand through control of the wave-probes (121) by the controller via electronic board (122). Calibration is performed by measuring s-parameters at the selected fundamental and harmonic frequencies using a pre-calibrated vector network analyzer (VNA). The VNA measures amplitude and phase of reflection factors in a 50 Ohm nominal environment at the input and output ports and transmission factors between them. If there are no amplifiers used, as is the case in FIGS. 16 and 17, the HAPC is a passive reciprocal network and the parameters S21 and S12 are equal (S21=S12). The fact that at least two wave-probes are present in the slabline section, however, complicates matters. Generating s-parameters for all possible permutations of amplitude and phase of the transmission factor of each probe can be an extremely long process. Assuming each wave-probe is set to 50 horizontal and 10 vertical (coupling) states, then each must be characterized at 500 settings. If a second wave-probe must be also characterized at 500 settings, then the required permutations are 250,000. Assuming one measurement and setting takes 1 second, this would require approximately 3 days. There must be another method, and there is: The technique used here uses a de-embedding algorithm, which allows the same task performed in only 1,000 seconds (approximately 17 minutes).

To do so the s-parameters of the HAPC transmission path from input to output port must be measured with both wave-probes withdrawn from the slabline (Coupling=0) and saved as a INIT matrix [S00] for all selected frequencies. Then, in a second step, each wave-probe individually is moved to a number of phase (X) and coupling (Y) settings, and s-parameters are measured and saved. Subsequently the inverse matrix [S00]$_{-1}$ must be cascaded with the s-parameters of the second (and any subsequent) wave-probe s-parameter matrix and saved.

Herein lies, though, the fundamental difference with a linear cascaded structure compare FIGS. 7, 9 and 15). In FIG. 7 wave-probe 1 (72) is always closer to the input port, so there is equivocal cascading and de-embedding sequence. In FIGS. 9, 13, and 14 to 17, however, which correspond to the physical layout of the herein disclosed apparatus, either of the two (or more) wave-probes can be the first one (closest to the test port), depending on their actual horizontal position relative to the input port. If (X1<X2) then wave-probe #1 is the first. If not, then wave-probe #2 becomes the front coupler. Cascading and de-embedding must respect this condition. This occurs during matrix generation in memory.

Cascading s-parameters is not directly possible, they must be converted to [ABCD] or T-parameters: [S]→[T]; as the s-parameters measured for each wave-probe are listed associated with their X and Y coordinates, the s-parameter sets have the following format: [S1(Xi,Yj)] and [S2(Xm,Yn)]. Hereby Xi can be >, < or = to Xm. During matrix de-embedding and cascading, if (Xi≤Xm), then [T1(Xi,Yj)]= [T1.mes(Xi,Yj)] and [T2(Xm,Yn)]=[T00]$^{-1}$*[T2.mes(Xm, Yn)] whereby "mes" indicates the measured values. If (Xi>Xm), then [T2(Xm,Yn)]=[T2.mes(Xm,Yn)] and [T1

(Xi,Yj)]=[T00]$^{-1}$*[T1.mes(Xi,Yj)]; hereby [T00] is the T-form of [S00] and [T(a,b)] is the T-form of any [S(a,b)] complex matrix.

Subsequently the permutations of the cascade of all s-parameter matrices of all wave-probes are generated in computer memory for all selected frequencies, as shown above, a task that takes only seconds. This way the effect of the body of the transmission path of the HAPC is extracted from the raw s-parameter measurement of all wave-probes, except for the actual first one; otherwise the cascade would comprise the parameters of the HAPC body ([S00]) twice, three times etc. In terms of calibration of the two-port between the input port and the output port, all possible setting permutations must be characterized. If three couplers are used to control a third harmonic frequency without using this de-embedding algorithm, the duration would be 500×3 days, or 5 years.

Once the HAPC is calibrated at a certain number of settings the data can be used for attenuation and phase adjustments. However the typical 600 or up to 1000 settings for frequency may not be sufficient, in particular for simultaneous and independent fine adjustment. Typically a few millions of possible setting permutations are needed. These can only be created using interpolation between calibration points. As can be seen in FIG. 11 the coupling factor can be adjusted smoothly using the wave-probe penetration (Y), when displayed in logarithmic scale [dB]: Coupling: C[dB] =A*Y/Ymax, whereby Y=0 designates full wave-probe withdrawal (C=−∞dB) and Y=Ymax designates the wave-probe quasi touching the center conductor (C=0 dB); and A is a constant empirical calibration factor. The phase adjustment is simple, the phase is proportional to the frequency and linear distance (X) from the input port: Φ=−2π*X/λ, whereby λ is the wavelength: λ[cm]=300/Freq[GHz]. Then interpolation can use a linear algorithm between calibration points $(X_i,Y_i)$ as follows:
Horizontal (Phase): $[S(X,Y_j)]=(X-X_1)/(X_{i+1}-X_i)*([S(X_{i+1},Y_j)]-[S(X_i,Y_j)])$ and, using the result of the first relation:
Horizontal (phase) and Vertical (Coupling, dB): $[S(X,Y)]=(Y-Y_j)/(Y_{j+1}-Y_j)*([S((X,Y_{j+1})]-[S(X,Y_j)])$. The interpolation algorithm is applied to each de-embedded coupler separately and for each frequency, before the matrices are cascaded in computer memory.

When a specific attenuation and phase of the transmission factor S21=Real(S21)+j*Imag(S21) or S21=|S21|*exp(jΦ21) needs to be generated by the HAPC, this can only be done numerically using appropriate searching through the {S21(Xi, Yj)} calibrated and interpolated transmission factor space. In case the load impedance is not 50Ω ($\Gamma_{load}\neq 0$) and the reflection factor into the output port S22≠0, the transmission factor b2/a1=S21/(1−S22*$\Gamma_{load}$) must be considered instead of simply S21; whereby b2 is the outgoing power wave and a1 the incident one. As already stated the calibrated settings may be insufficient to satisfy the target specifications for all frequencies simultaneously. In that case interpolated values are needed, calculated as shown above. The search works best in two steps. In a first step the search yields settings (Xo.i,Yo.j) corresponding to S21 values closest to the target S21.T at the fundamental frequency S21.T (Fo). Then, in a second step, a search is executed for calibrated and interpolated values close to (Xo.i,Yo.j), alternatively in Xi and Yj direction of all wave-probes, using an Error Function comprising all harmonic frequencies N*Fo: EF=ΣW(F)*|S21(Xi,Yj, F)−S21.T (F)|; EF is the weighed sum of all S21; hereby W(F) is a user selected weighing factor as a function of frequency. W(F) typically varies between 0 and 5, whereby when set to 0 this signifies that the corresponding frequency is considered irrelevant and when selected to 5 this means that this frequency is very important.

If the HAPC s-parameters are used in a complete test setup as in FIG. 2, then additional calibration steps must be carried out to characterize the adjacent components used in cascade with the HAPC, such as test fixtures and bias tees. FIG. 8 shows measured transmission vector data of an HAPC. Every point |S21(NFo)| and φ21(NFo) on the polar display corresponds, at each selected harmonic frequency, to a horizontal and vertical setting of the wave-probes. Hereby the input port is designated as port 1 and the output port as port 2. The data are saved in a calibration file and by proper motor control the states can be reactivated and every point in between can be interpolated within the resolution of the driving gear and stepper motors, using the previously disclosed relations.

It is important to recognize that HAPC with two wave-probes can control independently transmission factors at any two frequencies, such as Fo and 2Fo, or Fo and 3Fo etc. and HAPC with three (or more) wave-probes can control such values at three (or more) combinations of frequencies, all using the same calibration and synthesis algorithms but with different measured data.

The coupling factor of the wave-probes varies between −30 and −10 dB (FIG. 10). This means that the signal path between the input and the output port is strongly attenuated. If this cannot be tolerated by the application the signal must be amplified. This can be done by inserting linear amplifiers in the transmission path. The amplifiers must be linear in order to avoid phase distortion during tuning and amplitude adjustment. Nonlinearities in the signal transmission path will jeopardize the accuracy and validity of the calibration. The amplifiers can be inserted after the coupled ports of the wave-probes and either before or after the signal combiner. Inserting the amplifiers before the signal combiner (FIG. 16) requires a number of those, at additional cost. Inserting one amplifier between the signal combiner and the output port (FIG. 17) saves the cost of all but this amplifier, but puts additional requirements to the linearity of this amplifier, in order to avoid intermodulation and spurious nonlinearity effects. In any case the final choice is dictated by the signal level and the application.

This application discloses the concept of a compact, automated, harmonic, wideband variable attenuator and linear phase shifter for microwave frequencies and calibration algorithm and method for independent harmonic transmission control. Obvious alternatives shall not impede on the originality of the concept.

What I claim is:
1. A harmonic RF attenuation and transmission phase controller (HAPC) having an input and an output port and transmission media between the ports;
 whereby the transmission media comprises a cascade of slotted airline (slabline), at least two adjustable signal couplers (wave-probes) having a coupled port and an isolated port, multi-port signal combiner having at least two input ports and one combination port, flexible RF cables and characteristic impedance (Zo) terminations;
 and whereby the slabline comprises two parallel conductive walls, a center conductor and one input and one idle port and has characteristic impedance Zo;
 and whereby the wave-probes are inserted diametric from opposite sides into the slabline;
 and whereby the signal traversing the slabline is coupled into each of the wave-probes;

and whereby the signal coupled into each wave-probe is injected into an associated input port of the signal combiner and the combined signal exits from the combination port into the output port of the HAPC, and whereby the coupling factor of the wave-probes controls the amplitude and whereby the physical distance of the wave-probes from the input port controls the phase of the transmission factor of the HAPC at the fundamental and harmonic frequencies, and whereby the total length of the slabline available for wave-probe horizontal movement is at least one wavelength at the lowest frequency of operation.

2. The HAPC of claim 1, whereby each branch of the transmission media comprises one amplifier inserted between the coupled port of the wave-probe and the input port of the signal combiner.

3. The HAPC of claim 1 whereby the transmission media comprises one amplifier inserted between the combination port of the signal combiner and the output port.

4. The HAPC as in claim 1, whereby
one port of the slabline is the input port, and whereby
the idle port of the slabline, and
the isolated ports of the wave-probes
are terminated with characteristic impedance (Zo).

5. The HAPC as in claim 4, comprising at least two mobile carriages, having vertical axis each, the carriages being mounted diametric on top and bottom of the slabline and sliding independently horizontally along the slabline.

6. The HAPC of claim 5, whereby the wave-probes are attached to the vertical axis of the carriages and can be inserted independently diametric from opposite directions into the slot of the slabline and positioned at various distances from the center conductor.

7. The HAPC of claim 6, whereby the vertical axes are remotely controlled allowing independent adjustment of the coupling factors between the center conductor of the slabline and the wave-probes.

8. The HAPC as in claim 7, whereby the carriages are remotely controlled.

9. The HAPC as in claim 4, whereby the coupled ports of the wave-probes are connected to the input ports of the signal combiner using flexible RF cables and whereby the output port of the signal combiner is connected to the output port of the HAPC and whereby the isolated ports of the couplers are terminated with characteristic impedance (Zo).

10. The HAPC as in claim 4 or 9, whereby Zo is 50 Ohms.

11. A calibration method for HAPC as in claim 10, wherein the HAPC is connected to a pre-calibrated vector network analyzer (VNA) using RF cables and to a control computer using digital cables;

and scattering (s-) parameters are measured by the VNA between the input port and the output port of the HAPC at the fundamental frequency (Fo) and at least one harmonic frequency (N*Fo), for various settings of the coupling factors and the distances between the wave-probes and the input port, the settings being controlled by the computer, which is in operative communication with the VNA, whereby N=2, 3 . . . , in following steps:

a) all wave-probes are initialized (withdrawn from the slabline, reducing the coupling factors to negligible value) and s-parameters of the HAPC are measured and saved in a matrix [S00];

b) wave-probe 1 is inserted into the slabline in a number of steps Y1.j and for each Y1.j it is moved horizontally in a number of steps X1.i;

c) s-parameters [S1(X1.i,Y1.j)] are measured between the input and output ports and saved;

d) wave-probe 1 is initialized and step b) is applied to wave-probe 2 resulting in a matrix [S2(X2.i,Y2.j)];

e) step d) is applied to all other wave-probes, whereby all wave-probes are initialized except the wave-probe being controlled;

f) s-parameters of all wave-probes at all horizontal and vertical settings, except the wave-probe whose horizontal position is closest to the input port, are de-embedded using matrix $[S00]^{-1}$;

g) permutations of all s-parameter matrices are created in computer memory and saved in calibration files for all selected frequencies for later use.

12. A tuning method for HAPC uses calibration data generated in claim 11 as follows:

a) s-parameters are loaded in memory for selected frequencies Fo, 2Fo, . . . NFo;

b) error function EF is generated comprising the sum of vector differences between target transmission factor S21.T(F) and calibrated transmission factor S21.C(F) for all selected frequencies F=Fo, 2Fo, . . . NFo;

c) a search algorithm through the s-parameter space selects the carriage positions X1, X2, . . . XN and vertical axis positions Y1, Y2, . . . YN corresponding to minimum error function EF in step b);

d) carriages and vertical axes are positioned as in step c).

13. Interpolated transmission factors S21(F).I at each frequency (F) are used in claim 12, instead of calibrated ones.

* * * * *